United States Patent [19]
Wilson et al.

[11] Patent Number: 4,809,203
[45] Date of Patent: Feb. 28, 1989

[54] HYBRID ANALOG-DIGITAL FILTER

[75] Inventors: Dennis L. Wilson, Palo Alto; Patrick W. O'Connor, Sunnyvale, both of Calif.

[73] Assignee: Ford Aerospace & Communications Corporation, Detroit, Mich.

[21] Appl. No.: 899,839

[22] Filed: Aug. 25, 1986

[51] Int. Cl.⁴ ............................................. G06J 1/00
[52] U.S. Cl. .................................. 364/602; 370/32.1
[58] Field of Search .............. 364/600, 602, 715, 724, 364/807, 825; 381/68; 370/32.1; 379/411

[56] References Cited
U.S. PATENT DOCUMENTS

| | | | |
|---|---|---|---|
| 3,987,288 | 10/1976 | Franks | 364/602 |
| 4,001,555 | 1/1977 | Levis | 364/602 |
| 4,063,200 | 12/1977 | Mattern | 364/602 |
| 4,187,413 | 2/1980 | Moser | 381/68 |
| 4,539,675 | 9/1985 | Fisher | 370/32.1 |
| 4,621,172 | 11/1986 | Kanemasa | 370/32.1 |
| 4,667,298 | 5/1987 | Wedel | 364/602 |

Primary Examiner—Michael R. Fleming
Attorney, Agent, or Firm—K. R. Allen; E. J. Radlo; K. L. Zerschling

[57] ABSTRACT

A filter which uses both an analog portion and a digital portion to optimize the filter performance. A simple analog filter provides a rough filtering of the input signal. The output of the analog filter is converted into digital form and supplied to a digital filter. The coefficients of the digital filter are changed by a digital computer in order to correct for the errors in the filtered signal produced by the analog filter. The coefficients necessary for the digital filter to provide an error offset are determined by comparing the filtered value of a test signal through the analog filter to an ideal filtered value of such test signal.

16 Claims, 6 Drawing Sheets

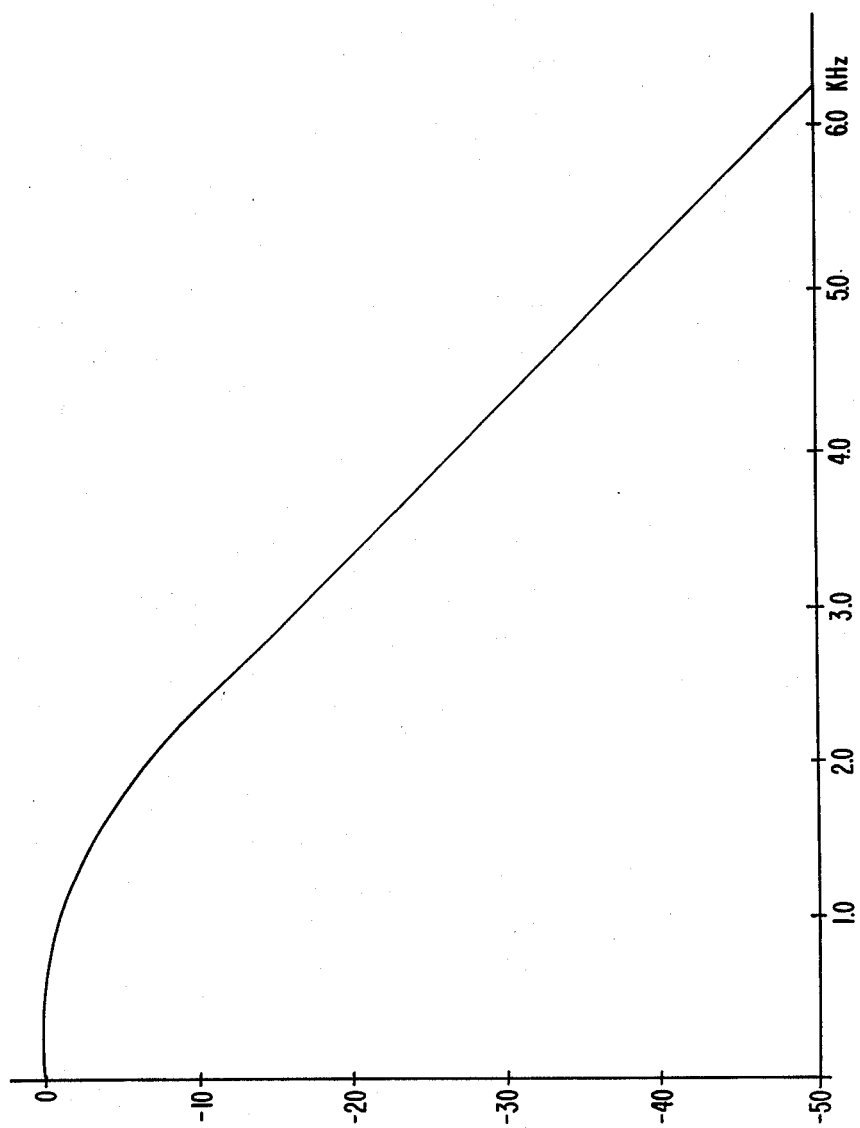
FIG._4.
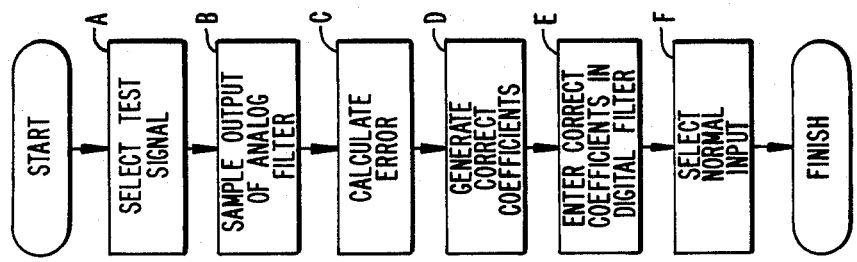
FIG._2.

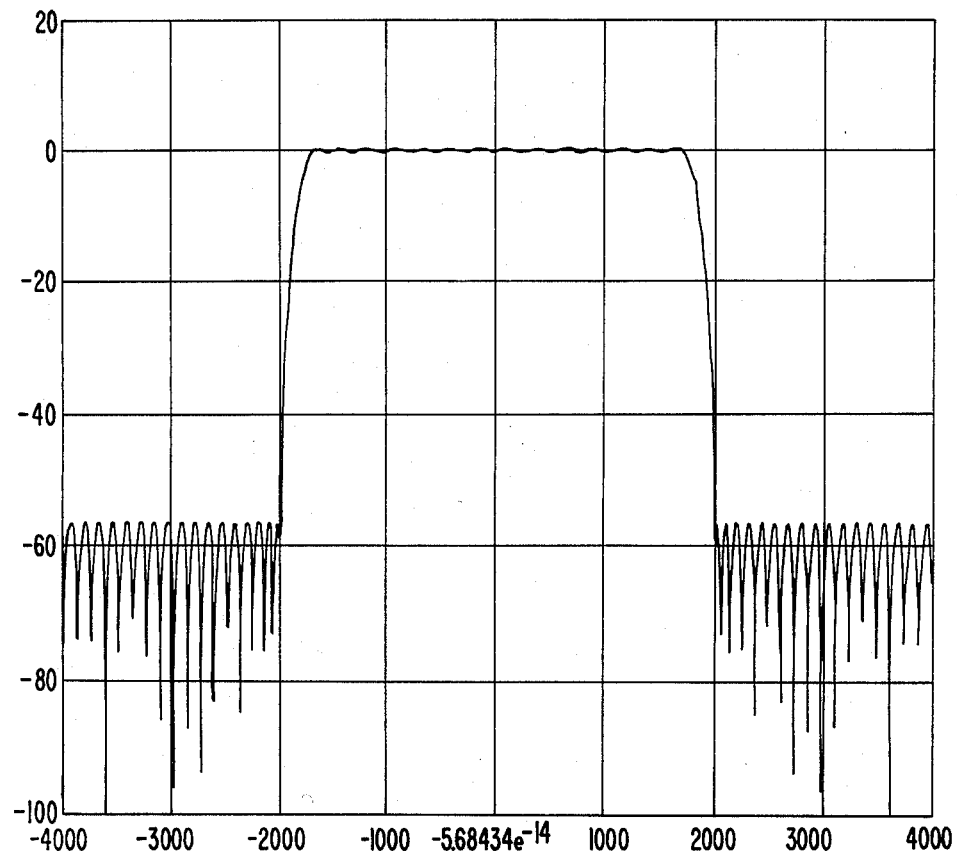
FIG._3.

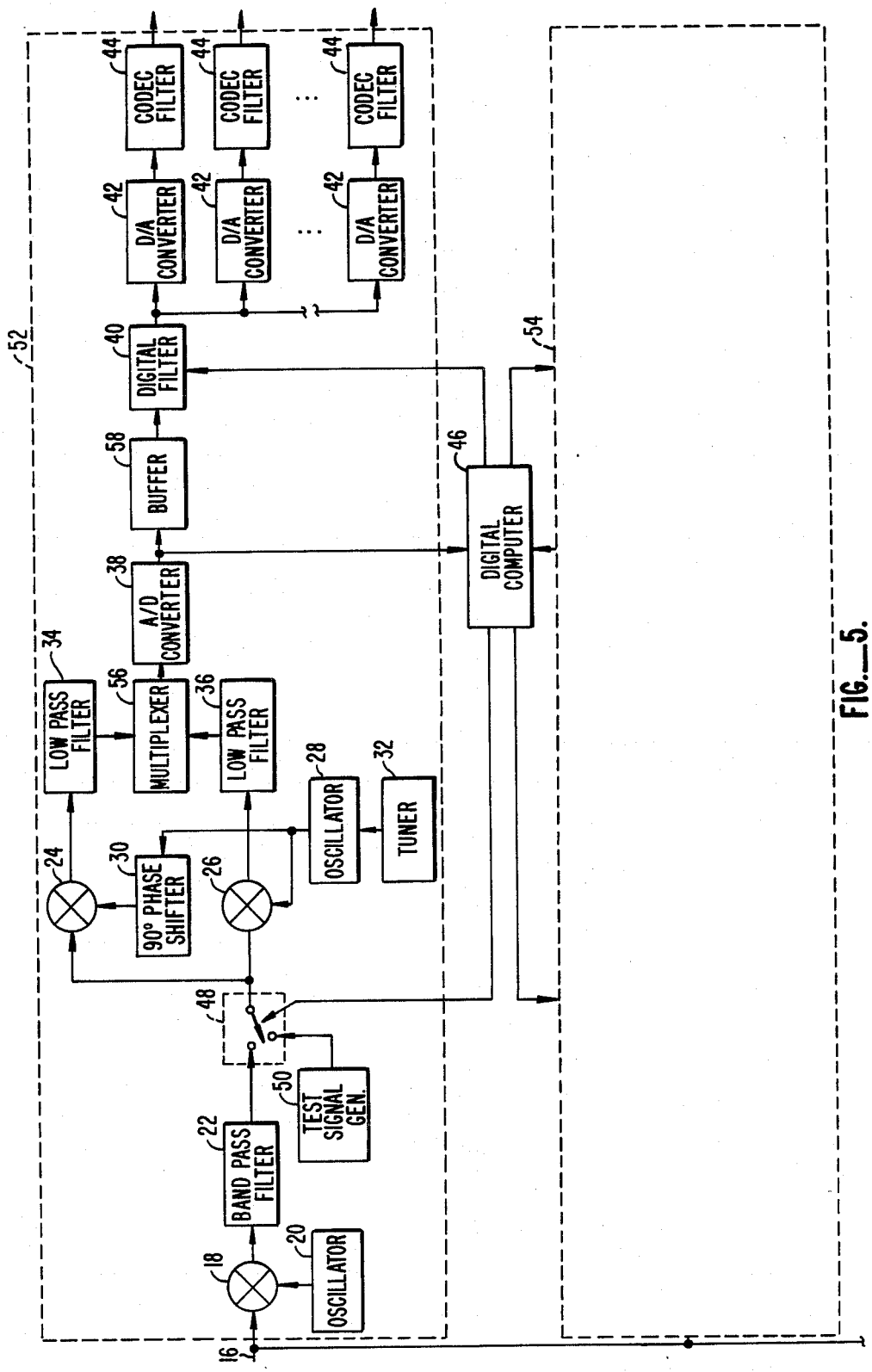
FIG._5.

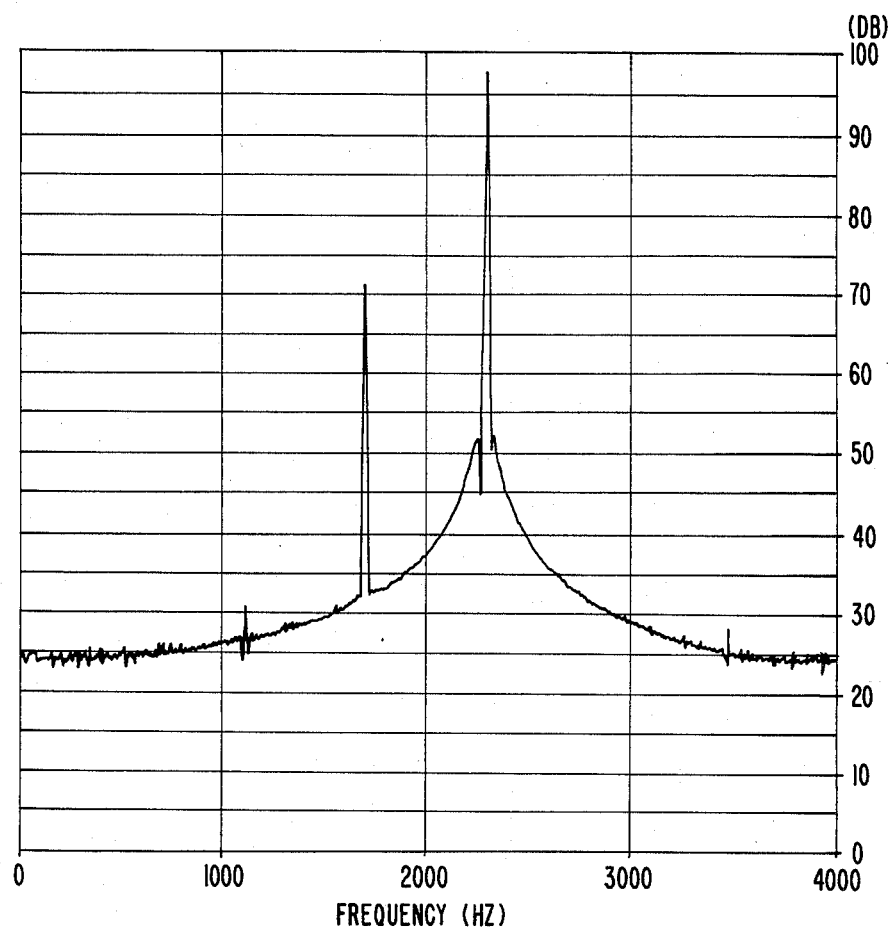
FIG._6.

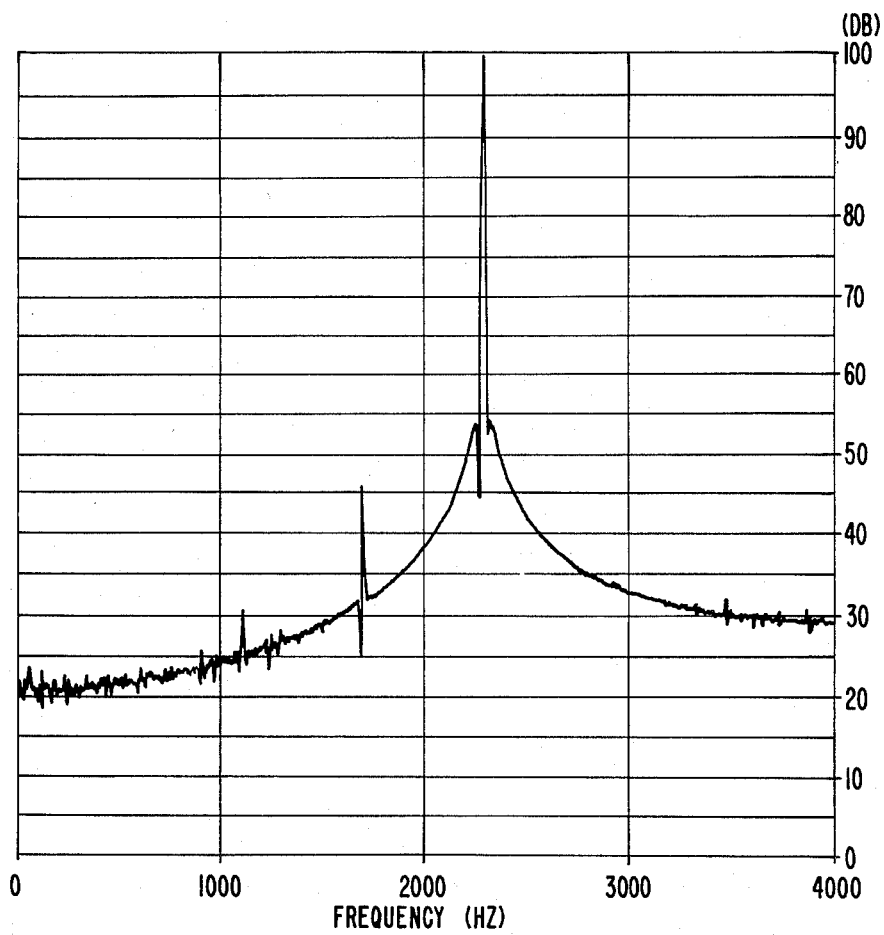
FIG._7.

HYBRID ANALOG-DIGITAL FILTER

BACKGROUND

The present invention generally relates to electrical filters and in particular to demultiplexers for frequency division multiplexed (FDM) signals.

Filters for electrical signals exist in both analog and digital form. Analog filters are constructed with components whose number and precision increases with the desired precision in the filtered signal. Digital filters can provide precise filtering but require a large number of samples, and thus a high sampling rate, when a large bandwidth of signals is to be filtered. Accordingly, there is a trade-off between digital and analog filters depending upon the application for which the filtering is to be used.

Frequency selective filters and down converters have been used for many years in communication applications. An example of a simple unit of this type is the standard AM broadcast receiver. In the communications world, a typical application is the demultiplexing of frequency division multiplexed (FDM) signals. These signals are created by single-sideband modulation (conversion) of 4 kilohertz (kHz) bandwidth channels and placing the modulated signals in a channelized spectrum relative to a carrier frequency. The function of the demultiplexer is to select one of a set of modulated signals that have been multiplexed together in frequency, convert that signal to its original baseband form, and output the baseband signal either in analog or digital form. In analog technology, a typical implementation is the use of a double superheterodyne single-sideband receiver. Such an implementation requires complex crystal filters. The incoming signal is mixed with a controlled oscillating signal to produce a higher frequency signal which will be within the range of the crystal filter for the demultiplexer. The particular frequency to be received can be selected by tuning the oscillator for the controlled frequency signal so that the resultant heterodyned signal of higher frequency will be within the range of the filter. The filtered signal is then converted down to the baseband audio frequency range where the signal can be understood by a person.

A separate analog filter is required for each channel. Cumulative bandwidths on the order of 15 megahertz (MHz) are typically obtainable.

When a digital filter is used instead, the signal must be converted from an analog signal to a digital signal and then passed through a digital filter. The digital filter can be constructed using fast Fourier transforms in which the signal is broken down into its separate frequency components and each component is multiplied by a predetermined coefficient to produce the filtering desired. The drawback of digital filtering is the large number of computations required, which limits the bandwidth attainable. Bandwidths for digital implementations are typically limited to approximately 1 megahertz with currently available hardware.

SUMMARY OF THE INVENTION

The present invention provides a filter which uses both an analog portion and a digital portion to optimize filter performance. A simple analog bandpass filter provides an initial coarse filtering of the input signal. The output of the analog filter is converted into digital form and supplied to a digital filter. The coefficients defining the characteristics of the digital filter are changed by a digital computer in order to correct for the errors in the filtered signal produced by the analog filter. The coefficients necessary for the digital filter to provide an error offset are determined by comparing the filtered value of a test signal through the analog filter to an ideal filtered value of such test signal.

Preferably, an input signal is mixed with a fixed frequency signal to convert the entire baseband up to a higher frequency which is then filtered by a bandpass filter. The resultant signal is applied to a pair of mixers where it is modulated by the in-phase components and the quadrature components of a variable frequency signal which can be tuned to the desired channel. The output of each of these mixers is applied to a separate analog linear-phase, low-pass filter. The outputs of the two linear-phase, low-pass filters are applied to an analog-to-digital converter and then to a digital filter. The coefficients of the digital filter are controlled by a digital computer which is also coupled to the output of the analog-to-digital converter so that it may sample the analog filter output of a test signal.

The digital filter performs complex filtering but has its coefficients adjusted to shift the output frequency to produce a real signal output. Complex value filtering is needed to produce a quadrature component so that the phase of the signal can be adjusted.

By combining analog and digital techniques, the present invention eliminates the need for an analog filter with a large number of high precision components, allowing a simple analog filter to be used instead. In addition, the digital filter used need not have a high sampling rate because the analog filter has performed a large amount of the required filtering already.

Because the digital filter can adjust for errors, the two analog filters do not need to be closely matched, as required for prior art analog filters. In addition, the phase shifting to give the quadrature component of the variable frequency signal need not be precise.

For a fuller understanding of the nature and advantages of the invention, reference should be made to the ensuing detailed description taken in conjunction with the accompanying drawings.

BRIEF DESCRIPTION OF THE DRAWINGS

FIG. 2 is a flowchart of a program for the digital computer of FIG. 1 controlling the operation of the embodiment shown in FIG. 1;

FIG. 3 is a graph of the output characteristics of a general digital filter of FIG. 1;

FIG. 4 is a graph of the output characteristics of an analog 5 pole linear phase filter of FIG. 1;

FIG. 5 is a block diagram of the demultiplexer of FIG. 1 adapted to simultaneously process several channels for each baseband;

FIG. 6 is a graph of the response to a specific input of the analog filter of the embodiment of FIG. 1; and FIG. 7 is a graph of the response to a specific input of the embodiment of FIG. 1 after correcting coefficients for the digital filter have been calculated and implemented.

DETAILED DESCRIPTION OF THE PREFERRED EMBODIMENTS

Figure 1:
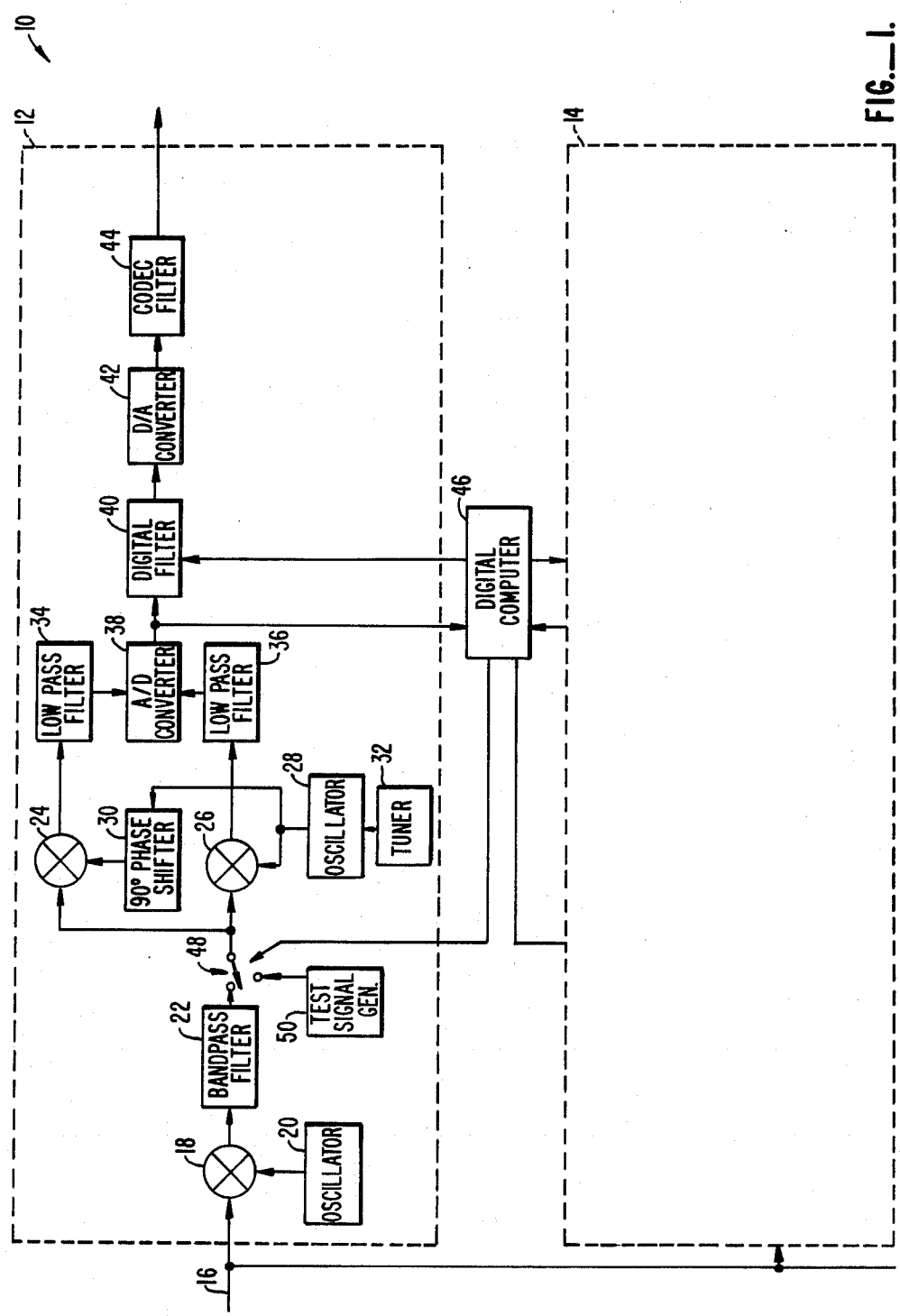
FIG. 1 is a block diagram of a frequency division demultiplexer according to the present invention.

FIG. 1 shows a preferred embodiment of a demultiplexer 10 according to the present invention. A separate demultiplexer circuit 12, 14 is provided for each baseband channel to be demultiplexed. The components of circuit 14 mirror those of circuit 12 with a different bandpass filter 22 being used for the different baseband. Additional demultiplexer circuits can be added if additional baseband channels are to be demultiplexed.

Looking at demultiplexer circuit 12, an input signal 16 is applied to a mixer 18 which is also supplied a signal of fixed frequency from an oscillator 20. Mixer 18 serves to heterodyne the signal, producing a higher frequency signal which is filtered in an analog bandpass filter 22. The output of filter 22 is applied to a pair of mixers 24, 26. Mixer 26 is used to combine the signal with an in-phase frequency from an oscillator 28, while mixer 24 uses the quadrature component of the same frequency signal which is phase-shifted by a 90° phase-shifter 30. The frequency of the channel to be selected is determined by a tuner 32 which controls the frequency of oscillator 28.

The outputs of mixers 24, 26 are applied to analog linear phase low-pass filters 34, 36 respectively. The output of filters 34 and 36 are supplied to an analog-to-digital converter 38 and then to a digital filter 40. The output of digital filter 40 is applied to a digital-to-analog converter 42 and to a CODEC filter 44. The coefficients of digital filter 40 are set by a digital computer 46.

If a 15 MHz baseband is used for input 16, oscillator 20 can be used to provide a signal out of mixer 18 that is centered on 30 MHz and extends from 22.5 MHz to 37.5 MHz. Since the whole baseband is being up-converted, conversion filter 22 can be a very simple filter. Only the direct feedthrough signal from 0 to 15 MHz need be attenuated strongly. In an application where multiple channels are to be demultiplexed, this up-conversion need be done only once for each of the basebands to be processed (i.e., once for circuit 12, once for circuit 14, etc.)

Once the signal is up-converted, the down-conversion and selection process can begin. The in-phase component and the quadrature phase component of the signal from oscillator 28 are applied to mixers 24 and 26 to produce a second intermediate frequency (IF) signal centered at 0 (zero) Hertz in frequency. The signals to be selected are tuned by using tuner 32 to vary the frequency of oscillator 28 so that the resultant signal from mixers 24 and 26 will be at 0 (zero) Hertz in frequency. The difference frequencies between −2 kHz and +2 kHz are the selected frequencies. The negative frequencies are handled by processing both the in-phase component and the quadrature component of the signal.

In a completely analog system, mixers 24 and 26 and filters 34 and 36 would have to be very carefully designed so that the quadrature and in-phase components of the signal are processed in the same manner. The present invention can compensate for differences in phase and amplitude produced by mixer 24 and low-pass filter 34 as compared to mixer 26 and low-pass filter 36. This compensation is accomplished by varying the coefficients of digital filter 40.

The operation of digital computer 46 of FIG. 1 can be understood with reference to the flowchart of its programmed operation in FIG. 2. Computer 46 first operates to throw a switch 48 to provide a test signal from test signal generator 50 to mixers 24 and 26 (Step A). Computer 46 then samples the output of A/D converter 36 (Step B) to determine the error in the output of filters 34, 36. The error is the difference between the received sample values and the ideal filtered values stored in the memory of computer 46 (Step C). The measured errors are then used to calculate the proper coefficients for digital filter 40 to compensate for the errors in analog filters 34 and 36 (Step D). Computer 46 then sets the coefficients of digital filter 40 to the desired value (Step E). Switch 48 can then be switched back to receive the input from bandpass filter 22 and normal processing can take place (Step F). The output of digital filter 40 is converted back to analog by D/A converter 42, if necessary. The output of D/A converter 42 is supplied to a CODEC (coder-decoder) filter 44 which removes the aliased frequencies, as required, and corrects for the sin x/x filtering characteristics of the sample and hold circuitry of digital-to-analog converter 42.

In more detail, the errors in the implementation of the analog portions of circuit 12 can be measured at digital filter 40 by introducing a sine wave from test signal generator 50 that is within the desired passband. At the output of analog-to-digital converter 38, what should appear at steady state is a sine wave in the in-phase leg of the unit and a sine wave of exactly the same amplitude in the quadrature leg that is 90° out of phase with the signal in the in-phase leg. The amplitude error can be measured by measuring the amplitudes of the two sine waves over time. The phase error can be measured by comparing the phase of the two signals.

To measure the amplitude and phase errors of the signal, a block of data in the digital filter must be collected for a measurement. The block of data should cover many cycles of the test signal to make the measurement accurate. A block of one hundred cycles of the data is adequate to measure the error with a signal-to-measurement error ratio of 50 dB. To measure the amplitude of the signal, computer 46 averages the difference between each negative peak and the following positive peak over 100 cycles. To measure the amplitude difference, computer 46 calculates the ratio of the two amplitudes.

To measure the phase difference, computer 46 multiplies the output of the in-phase component and the output of the quadrature component together and averages them over 100 cycles. The averaged product is proportional to the amplitude product of the two signals times the phase difference in radians. Since the amplitudes of the two signals are known from the measurement of the amplitude, the amplitude effects can be taken out, leaving a measure of the phase. The technique is much the same as used in phase measuring devices and phase locked loops except that no hard limiting is done. As a consequence, the amplitude corrections must be made in order to measure the phase error.

The basic design of digital filter 40 is performed in a straightforward manner. Several filter design routines are available for the determination of the coefficients of a finite impulse response filter. The application of a McClellan-Parks design routine to the design of a symmetric filter covering 64 points results in the filter whose bandpass characteristic is shown in FIG. 3.

This filter provides a filtering operation that passes the frequencies from −1700 Hz to +1700 Hz. The filter rolls off to more than 50 dB down in the very short space of 300 Hz. The filter coefficients are symmetric, so the filter introduces absolutely zero group delay distortion, a very desirable characteristic for a selection filter.

The basic filter may be modified to correct for the bandpass errors of the preceding analog filter. To make the analog filter easy to construct, it is convenient to make the filter a linear-phase filter. The bandpass characteristic of a five-pole linear-phase filter is shown in FIG. 4. The filter characteristic rolls off slowly, making the peak of the filter pass band characteristic quite round. The digital filter pass band characteristic may be modified to correct for the pass band characteristic of the preceding analog filter by correcting the pass band of the digital filter to compensate for the errors in the analog filter pass band. The resulting composite pass band is essentially that shown in FIG. 3, the same characteristic as the original filter. However, since the signal has already been through the analog filter, the characteristics of FIG. 3 can be obtained with a lower sampling rate. A sampling rate 1/10 of that required for a totally digital filter can be obtained. Alternately, the bandwidth can be increased by a factor of 10 at the same sampling rate.

Once the error has been measured, it can be corrected. The correction can be performed by modifying the coefficients of digital filter 40. The quadrature component may be made to be 90° out of phase with the in-phase component by subtracting from the quadrature component the in-phase component multiplied by the sine of the phase error. When the averaged cross product is taken with the correction made to measure the residual error, the subtracted component will balance the phase error, demonstrating that the two signals are 90° out of phase.

Once the phase has been corrected, the amplitude may be corrected. The amplitude of the in-phase component may be taken as a reference, and the amplitude of the quadrature component modified by changing the coefficients of the filter. Those coefficients that act to produce the quadrature component digital filter output need to be multiplied by the reciprocal of the ratio of the quadrature amplitude to the in-phase amplitude as measured. The result will be that the in-phase amplitude will be the same as the quadrature amplitude to within the accuracy of the measurement and the accuracy of the arithmetic (usually integer) used in the computations.

The complex coefficients of the basic digital filter may be modified to perform the manipulations of phase correction and amplitude correction described above. The gain of the signals through the in-phase and quadrature channels may be modified by changing the coefficients. For example, the gain of the in-phase component through the quadrature channel may be adjusted to remove an in-phase component in the quadrature channel. If a leakage component of 10% of the in-phase component appears in the quadrature channel, it may be removed by using a filter coefficient set that multiplies the in-phase component by −0.1, and then by adding the result to the quadrature component.

More generally, the amplitude and phase characteristics at a number of frequencies across the pass band may be measured. The digital filter coefficients may be adjusted [using techniques available to those knowledgeable in the art]to adjust the phase and amplitude characteristics to compensate for the phase and amplitude errors of the analog filter. The digital filter will typically have enough coefficients for very fine adjustment of the filter characteristics.

The signal that comes through the digital filter is a signal that is centered on zero Hertz frequency. The use of the zero Hertz center frequency makes the digital filter simple to construct. To be useful, the output signal must be shifted to be a real signal (centered on two KHz in this embodiment). With a sample rate that is four times the center frequency, this frequency shift is particularly simple. A complex sine wave at two kHz when sampled at eight kHz has only four values, (1,0), (0,1), (−1,0), (0,−1). The mixing operation corresponds to multiplying by plus or minus one. Furthermore, half of the multiplications are multiplications by zero and need not be performed.

To make the signal real, the quadrature component of the signal is discarded. As a consequence, the quadrature component need not be computed.

The required set of computations is then the computation of the in-phase component at one sample time, the quadrature component the next sample time, the negative of the real component the next sample time, and the negative of the quadrature component the next sample time. After that the cycle repeats. The actual set of computations consists of the computation of only one of the two components of the output of the filter at any one sample output.

The completion of the operation is straight-forward. The real signal is passed through a digital-to-analog converter 42 to convert it to analog form. Analog filter 44 is applied to the output to correct for the sin x/x bias introduced by the conversion and to suppress the aliased signals that lie above the pass band of the signal. In the embodiment shown, the filter can be a very inexpensive filter known in the industry as a CODEC filter, used for just these purposes in digital telephony.

The up conversion process applies to all of the channels of the baseband at one time. It need not be done for each channel that is to be processed, only for each baseband that is to be processed. After the up conversion, thee is a basic analog process that must be performed for each channel that is to be processed. The process consists of the down conversion to the zero Hz IF frequency and the coarse filtering of the analog low-pass filters.

In one embodiment, shown in FIG. 5, the digital processing is performed on multiple channels at one time. Analog-to-digital converter 38 is preceded by a multiplexer 56 that presents the signals that are to be converted to the sample and hold that is part of analog-to-digital converter 38. In this manner many signals may be converted with the same circuit 52 or 54.

The elements that perform the digital processing have a capacity for computation that exceeds that required for a single channel by a large margin. Once the conversion to digital form has been made by A/D converter 38, the signal samples are buffered by buffer 58 for filtering by digital filter 40, which can compute the required outputs for many signals at once. Once the signals are available for digital-to-analog conversion, the distribution to multiple analog outputs must be performed. There are as many D/A converters 42 and CODEC filters 44 as there are channels to be processed.

In applications where a digital form of the filtered output is appropriate, the output of the digital filter may be retained in a time division multiplexed form for distribution as required.

FIGS. 6 and 7 illustrate the utility of the technique of the present invention. In FIG. 6 the spectrum of a signal where there has been no correction of the errors of the analog filter is shown. The amplitude errors are five percent and the phase error is five degrees. The result is an image of the input sine wave that is less than 20 dB below the signal itself. The image must be suppressed to form a good demultiplexer.

In FIG. 6 the corrections have been made using the coefficients of the digital filter. The results show that the image has been reduced by more than 20 dB. More careful estimation of the phase and amplitude error can reduce the image even further.

As will be understood by those familiar with the art, the present invention may be embodied in other specific forms without departing from the spirit or essential characteristics thereof. For example, a combination analog and digital filter could be used in other applications than frequency division demultiplexing. Accordingly, the disclosure of the preferred embodiment of the invention is intended to be illustrative, but not limiting, of the scope of the invention which is set forth in the following claims.

What is claimed is:

1. An apparatus for filtering an electrical signal comprising:
   an analog filter means operative to receive as input said electrical signal and to produce as output an analog output signal;
   an analog-to-digital converter coupled to receive said analog output signal of said analog filter means and to produce a digital output signal;
   a digital filter coupled to receive digital output signals of said analog-to-digital converter, said digital filter including a plurality of coefficients to be applied to a plurality of frequency components of said electrical signal; and
   means, coupled to said digital filter and including means coupled to receive and respond to errors in said analog output signal from said analog filter means, for altering said coefficients to substantially offset said errors.

2. The apparatus of claim 1 further comprising a 90° phase shifter for producing a quadrature component of said electrical signal in addition to an in-phase component, said analog filter means comprising first and second filters for filtering said quadrature and in-phase components, respectively.

3. The apparatus according to claim 2 wherein said first and second filters are linear-phase-type filters.

4. The apparatus of claim 2 wherein said means for altering said coefficients comprises a digital computer adapted to measure an amplitude difference and a phase difference between filtered values of said quadrature and in-phase components.

5. The apparatus of claim 1 further comprising means for storing a digital sample of said filtered signal from said analog filter means for error measurement.

6. The apparatus of claim 1 wherein said digital filter is a complex component-type filter and further comprising means for shifting an output of said digital filter to produce a real output.

7. The apparatus of claim 1 further comprising means coupled to an input of said analog filter means, for mixing said electrical signal with a second signal to produce an intermediate frequency signal for filtering.

8. The apparatus of claim 7 further comprising second means for mixing said intermediate frequency signal with a third signal, said third signal being variable in frequency for tuning.

9. The apparatus of claim 8 further comprising a plurality of filter circuits coupled to a single input for filtering a plurality of baseband signals, each filter circuit including elements identical to said first and second mixing means, said analog filter means, said analog-to-digital converter and said digital filter.

10. The apparatus of claim 1 further comprising:
    means, coupled between said analog filter means and said analog-to-digital converter, for multiplexing a plurality of channels of said electrical signal; and
    buffer means, coupled between said analog-to-digital converter and said digital filter, for temporarily storing a digital representation of said plurality of channels, 11. An apparatus for filtering an electrical signal comprising:
    first means for mixing said electrical signal as a first signal with a second signal to produce an intermediate frequency signal;
    means for generating an in-phase component and a quadrature component of a third signal, said third signal being variable in frequency for tuning;
    second means coupled to receive said intermediate frequency signal and said in-phase component for mixing said intermediate frequency signal with said in-phase component of said third signal;
    third means coupled to receive said intermediate frequency signal and said quadrature component for mixing said intermediate frequency signal with said quadrature component of said third signal;
    first and second analog filters coupled to said second and third mixing means, respectively;
    an analog-to-digital converter coupled to first and second analog filter;
    a digital filter coupled to said analog-to-digital converter, said digital filter including a plurality of coefficients to be applied to a plurality of frequency components of said electrical signal;
    means, coupled to said analog-to-digital converter, for measuring variations between a filtered output of said analog-to-digital converter and an ideal filtered output value;
    means for altering said coefficients of said digital filter to compensate for said variations; and
    means for shifting an output of said digital filter to produce a real output.

12. The apparatus according to claim 11 wherein said first and second analog filters are linear-phase filters.

13. A method for filtering an electrical signal with an analog filter and a digital filter comprising:
    applying a test signal to an input of said analog filter;
    converting a filtered test signal output of said analog filter into a digital filtered test signal;
    comparing said digital filtered test signal to an ideal filtered signal to determine an error signal;
    calculating coefficients needed for said digital filter to substantially offset said error signal and produce substantially said ideal filtered signal;
    thereafter applying said electrical signal as an input signal to be filtered to said analog filter;
    digitizing an output of said analog filter; and
    applying said digitized output of said analog filter to said digital filter.

14. The method of claim 13 further comprising, prior to said step of applying said input signal to said analog filter, the steps of:
    mixing said input signal with a second signal to produce an intermediate frequency signal;
    producing in-phase and quadrature components of a third signal; and mixing said intermediate frequency signal with said in-phase and quadrature components of said third signal.

15. The method of claim 14 further comprising the steps of:
performing complex filtering with said digital filter of said output of said analog filter; and
shifting an output of said digital filter to produce a real signal.

16. The method of claim 14 further comprising the steps of:
mixing said intermediate frequency signal with in-phase and quadrature components of a plurality of different third signals to detect a plurality of channels; and
multiplexing the outputs of said last mentioned mixing step.

* * * * *